United States Patent
Rockenfeller

(10) Patent No.: US 8,293,388 B2
(45) Date of Patent: *Oct. 23, 2012

(54) THERMAL ENERGY BATTERY AND METHOD FOR COOLING TEMPERATURE SENSITIVE COMPONENTS

(75) Inventor: Uwe Rockenfeller, Boulder City, NV (US)

(73) Assignee: Rocky Research, Boulder City, NV (US)

( * ) Notice: Subject to any disclaimer, the term of this patent is extended or adjusted under 35 U.S.C. 154(b) by 762 days.

This patent is subject to a terminal disclaimer.

(21) Appl. No.: 12/396,333

(22) Filed: Mar. 2, 2009

(65) Prior Publication Data

US 2010/0221586 A1 Sep. 2, 2010

(51) Int. Cl.
*H01M 2/00* (2006.01)
*F25B 15/00* (2006.01)
*F25B 17/08* (2006.01)
*F25D 23/00* (2006.01)
*F28D 15/06* (2006.01)

(52) U.S. Cl. .................... 429/8; 429/6; 429/50; 62/112; 62/142; 62/269; 62/259.2; 62/480; 165/104.15

(58) Field of Classification Search .................. 429/112, 429/50, 61, 6, 8; 62/497, 480, 323.1, 112, 62/142, 259.2, 269; 428/375, 380, 292.1; 423/352, 299; 165/104.12, 104.15; 426/109

See application file for complete search history.

(56) References Cited

U.S. PATENT DOCUMENTS

| | | | |
|---|---|---|---|
| 5,441,716 A | 8/1995 | Rockenfeller et al. | |
| 6,103,280 A * | 8/2000 | Molzahn et al. | 426/109 |
| 6,224,842 B1 | 5/2001 | Rockenfeller et al. | |
| 6,736,194 B2 | 5/2004 | Rockenfeller et al. | |
| 2002/0073726 A1* | 6/2002 | Hasebe et al. | 62/323.1 |
| 2002/0166335 A1* | 11/2002 | Smith et al. | 62/480 |
| 2002/0189279 A1* | 12/2002 | Pfister et al. | 62/497 |
| 2006/0147691 A1 | 7/2006 | Rockenfeller et al. | |
| 2006/0147710 A1 | 7/2006 | Rockenfeller et al. | |

OTHER PUBLICATIONS

Yanhe et al., "Kinetics of enhanced adsorption polarization for organic pollutants on activated carbon fiber", Front. Environmental Science Engineering, 1(1): pp. 83-88, China, 2007.*

* cited by examiner

*Primary Examiner* — Jonathan Crepeau
*Assistant Examiner* — Kenneth Douyette
(74) *Attorney, Agent, or Firm* — Knobbe Martens Olson & Bear, LLP

(57) ABSTRACT

A thermal energy battery for cooling temperature sensitive components comprises a composite of a sorbent with ammonia, water, alcohol, amine or a fluorocarbon refrigerant absorbed thereon and incorporated on a substrate material. The composite is encased in a containment material configured to rupture or otherwise release refrigerant desorbed by the sorbent composition when internal battery pressure reaches a threshold ΔP from the outside pressure, and thermal conduction means in thermal contact with the thermal energy battery and one or more temperature sensitive components for directing thermal energy therebetween to heat the composite and cool the temperature sensitive components.

32 Claims, 1 Drawing Sheet

THERMAL ENERGY BATTERY AND METHOD FOR COOLING TEMPERATURE SENSITIVE COMPONENTS

BACKGROUND OF THE INVENTION

Cooling of temperature sensitive components such as electronic and computer system components to predetermined temperatures and temperature ranges is important in maintaining component operating efficiency. Such components have critical operating temperature thresholds, above which operating efficiency is reduced, often dramatically, especially as temperatures continue to rise. Microprocessors, memory chips, graphics cards, hard drives, transistors, power supplies and/or other computer electronic components used in vehicles or in guidance systems of missiles, rockets, smart bombs or unmanned attack or surveillance equipment may not be cooled by conventional heat exchangers or cooling systems. The thermal energy battery described herein may be used to provide effective cooling of such temperature sensitive components and is especially suitable where recharging of the battery for continued cooling output is not required.

SUMMARY OF THE INVENTION

One embodiment is a thermal energy battery comprising a composite incorporating a sorbent system configured to desorb and release refrigerant at composite temperatures at or above a pre-determined trigger temperature, a containment material encasing the composite and configured to rupture and/or enable release of desorbed refrigerant released by the composite when the internal battery pressure reaches a threshold pressure differential ($\Delta P$) from the pressure outside of the battery, and thermal conduction means in thermal contact with the thermal energy battery and one or more temperature sensitive components for directing heat from the components to the battery and cooling from the battery to the temperature sensitive components. The battery operates in response to heat directed to the composite from one or more temperature sensitive components via the thermal conduction means. As the composite is heated, the sorbent system desorbs refrigerant thereby increasing internal battery pressure. At trigger temperature a threshold $\Delta P$ causes containment rupture and the thermal energy battery releases refrigerant. Such refrigerant release rapidly cools the composite, and the cooling is directed to the temperature sensitive components via thermal conductors or by direct contact with the component(s). Also described is a method of cooling a heat sensitive component utilizing the aforesaid thermal energy battery and thermal conduction components.

DETAILED DESCRIPTION OF PREFERRED EMBODIMENTS

Figure 1:
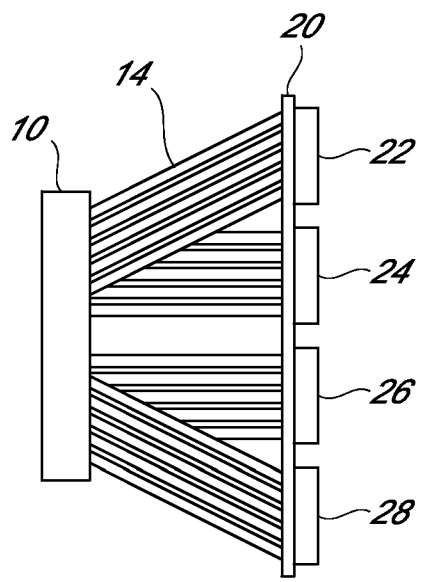
FIG. 1 is a side view of an embodiment showing a thermal energy battery and thermal conductors extending from the battery to a circuit board with temperature sensitive components mounted thereon.

One embodiment is a thermal energy battery as described herein. A sorption system used in the thermal energy battery may comprise a sorbent on which a refrigerant is adsorbed or absorbed, and from which the refrigerant is readily desorbed. Sorbent compositions include bivariant systems such as zeolites, silica gel or activated carbon sorbents with a refrigerant including ammonia, water, alcohols and amines as well as fluorocarbons, e.g., CFCs, HFCs, HCFCs. Although useful, such bivariant systems are not preferred because the absorbent vapor pressure is a function of temperature and the refrigerant concentration whereby the cooling effect and efficiency decreases as refrigerant is desorbed. The preferred composite composition used in the thermal energy battery described herein is a monovariant system comprising a complex compound of ammonia, water, alcohol or amine refrigerant and a metal salt and/or a metal hydroxide of a metal selected from the group consisting of alkali metal, alkaline earth metal, transition metal, zinc, cadmium, tin, aluminum or two or more thereof. Ammonia and water may be the preferred refrigerants for many uses but in certain environments it may be desirable to use an alcohol or an amine refrigerant in the complex compound. In one embodiment, a metal salt comprises a halide, nitrate, nitrite, oxalate, perchlorate, sulfate or sulfite. The complex compounds, their chemistry, preparation and the coordination steps of water and particularly ammonia with the salts to form such complex compounds are described in substantial detail in U.S. Pat. No. 5,441,716, the description of which is incorporated herein by reference in its entirety.

The composite further comprises the aforesaid complex compounds incorporated on a substrate material. Preferred substrates are woven or unwoven materials, including woven fabric or cloth as well as nonwoven strands or fibers which may be packed to form a coherent substrate capable of supporting and forming a composite structure for the complex compounds.

In one embodiment, the refrigerant releasing composite products described herein are fabricated from a substrate material comprising woven or intertwined polarized strands or layered strands of the substrate. Such woven or intertwined substrate material incorporate or utilize elongated or continuous fibers such as fabrics or cloth or unwoven intertwined fiber materials such as yarn, rope or the like where the fibers or strands of fibers have been twisted or formed in a coherent form such as yarn or weaves of strands. Various or different weaving patterns may be used. In one embodiment, three-dimensional weaves are used which yield multi-directional strength characteristics as compared to two-dimensional weaves having anisotropic strength characteristics. One embodiment of a substrate utilizes elongated and/or continuous fibers or filaments as opposed to chopped or loose fibers or strands in which there is no interlocking or structural pattern to the fibrous substrate in order to achieve good mechanical strength. However, non-woven fibers including mat, batting, felt or chopped or loose fiber materials are useful for the purpose of refrigerant release composites, but offer less mechanical strength. Suitable materials also include needle woven layers of substrate fiber strands. Alternatively, layers of elongated, substantially continuous fiber strands which have not been woven in a three-dimensional weave may be used. Successive layers of the fibers are preferably positioned along different axes so as to give the substrate strength in multiple directions. Moreover, such layers of non-woven fibers can be positioned between layers of woven fibers.

In some embodiments, the substrate material of which the fiber strands are made may include glass, polyamide, polyphenylene sulfide, carbide (e.g., silicon carbide), carbon or graphite fibers. Glass fibers are a preferred fiber material, woven glass fibers being relatively inexpensive and woven glass fiber fabric easy to handle and process in preparing the composites. The glass fibers may be E-glass and/or S-glass, the latter having a higher tensile strength. Glass fiber fabrics are also available in many different weaving patterns which also makes the glass fiber material a good candidate for the composites. Carbon and/or graphite fiber strands may also be used. Polyamide materials or nylon polymer fiber strands are also useful, having good mechanical properties. Aromatic polyamide resins (aramid resin fiber strands, commercially available as Kevlar® and Nomex®) are also useful. Yet another useful fiber strand material is made of polyphenylene sulfide, commercially available as RYTON®. Combinations of two or more of the aforesaid materials may be used in making up the substrate, with specific layered material selected to take advantage of the unique properties of each of them. The substrate material preferably has an open volume of at least about 30%, and more preferably 50% or more, up to about 95%. The specific substrate material selected and used, as well as the percentage of open volume, may depend on the expected uses, including environmental exposure conditions, substrate melting temperatures, and the like.

The surface of the fibers and fiber strands of the aforesaid substrate material may be sufficiently polarized to at least provide some bonding between the fiber and the absorbent crystals adequate to achieve the below loading densities. Polarized fibers are commonly present on commercially available fabrics, weaves or other aforesaid forms of the substrate. If not, the substrate may be treated to polarize the fiber and strand surfaces. The surface polarization requirements of the fiber, whether provided on the substrate by a manufacturer, or whether the fibers are treated for polarization, is preferably sufficient to achieve a loading density of the metal salt or hydroxide on the fiber of at least about 0.3 grams per cc of open substrate volume whereby the bonded metal compound bridges at least some adjacent fiber and/or adjacent strands of the substrate. Polarity of the substrate material may be readily determined by immersing or otherwise treating the substrate with a solution of the salt or hydroxide, drying the material and determining the weight of the metal compound polar bonded to the substrate. Alternatively, polar bonding may be determined by optically examining a sample of the dried substrate material and observing the extent of metal compound bridging of adjacent fiber and/or strand surfaces. Even prior to such bonding determination, the substrate may be examined to see if excessive oil or lubricant is present on the surface. Oil coated material will substantially negatively affect the ability of the substrate fiber surfaces to form an ionic, polar bond with a metal salt or metal hydroxide. If excessive surface oil is present, the substrate may be readily treated, for example, by heating the material to sufficient temperatures to burn off or evaporate most or substantially all of the undesirable lubricant. Oil or lubricant may also be removed by treating the substrate with a solvent, and thereafter suitably drying the material to remove the solvent and dissolved lubricant. Substrates may also be treated with polarizing liquids such as water, alcohol, inorganic acids, e.g., sulfuric acid.

A sorbent for the polar gas refrigerant comprising metal salt, or metal hydroxide, is bonded to the surface of the polarized substrate material by impregnating, soaking, spraying, flowing, immersing or otherwise effectively exposing the substrate surface to the metal compound. One method of bonding the sorbent to the substrate is by impregnating, soaking, or spraying the material with a liquid solution, slurry or suspension or mixture containing the metal salt or hydroxide followed by removing the solvent or carrier by drying, heating and/or by applying a vacuum. The substrate may also be impregnated by pumping a salt or hydroxide suspension, slurry or solution or liquid-salt mixture into and through the material. Where the liquid carrier is a solvent for the salt, it may be preferred to use a saturated salt solution for impregnating the substrate. However, for some cases, lower concentrations of salt or hydroxide may be used, for example, where necessitated or dictated to meet permissible loading densities. Where solubility of the salt or hydroxide in the liquid carrier is not practical or possible, substantially homogeneous dispersions may be used. Where an electrostatically charged substrate is used, the salt or hydroxide may be bonded by blowing or dusting the material with dry salt or hydroxide particles.

Methods of incorporating the complex compound on the substrate material are further described in U.S. Pat. No. 6,736,194 and in U.S. Patent Application Publications 2006/0147691 and 2006/0147710, all of which are incorporated herein in their respective entireties.

The thermal energy battery composite may be coated or encased in a containment material comprising a skin or shell configured to be ruptured or otherwise release the refrigerant at a pre-selected pressure differential between the pressure inside of the unruptured containment material and the outside pressure, which differential pressure is referred to herein as $\Delta P$. The internal pressure of the battery is responsive to the temperature of the composite. The complex compound is selected to desorb refrigerant at a temperature range to which it will be heated by the temperature sensitive components. As the battery continues to absorb heat driving the endothermic desorption of refrigerant from the complex compound the internal battery pressure increases. When the internal pressure reaches threshold $\Delta P$, the containment material ruptures or otherwise releases refrigerant from the battery resulting in rapid and intensive cooling of the battery material.

The apparatus also includes a thermal conduction means in the form of metal or other thermal conductors such as rods, struts, arms, shafts, pins, plates, pads, mesh or combinations of two or more of such thermal conductors or their equivalents which are capable of conducting thermal energy between a temperature sensitive component and the thermal energy battery. Other examples of useful thermal conductors include heat pipes or thermosyphons.

Figure 2:
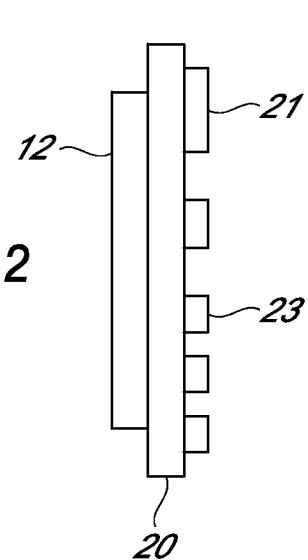
FIG. 2 illustrates an embodiment with a thermal energy battery positioned against a circuit board with mounted temperature sensitive components.
Figure 3:
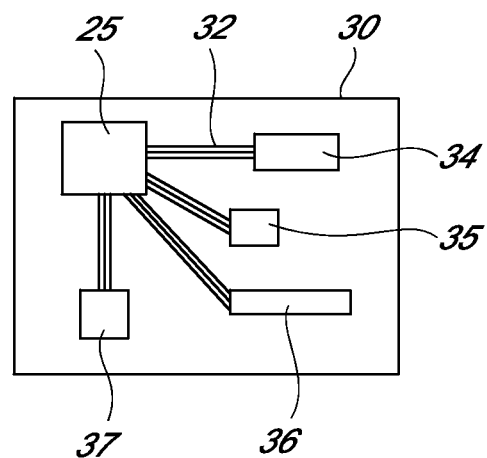
FIG. 3 illustrates an embodiment with the thermal energy battery mounted on a circuit board with thermal conductors extending between the battery and temperature sensitive electronic components.
Figure 4:
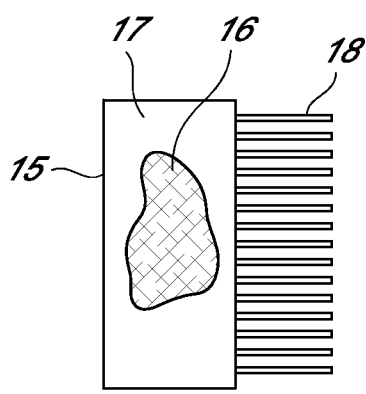
FIG. 4 is a side elevational view of a thermal energy battery with the containment material partially cut away to expose composite and showing thermal conductors extending from the battery.

Referring to FIG. 1, there is illustrated a thermal energy battery 10, a circuit board 20 on which are mounted temperature sensitive components 22, 24, 26 and 28, and a plurality of thermal conductors 14 which are in thermal contact with the heat sensitive components and the thermal energy battery. In FIG. 2, thermal energy battery 12 is positioned against the circuit board 20 with its temperature sensitive components 21 and 23 whereby the thermal energy battery is in direct thermal contact with the heat sensitive components to be cooled by the battery upon release of refrigerant. In FIG. 3, thermal energy battery 25 is mounted on the face of circuit board 30, and thermal energy is directed between heat sensitive electronic components 34, 35, 36, 37 via thermal conductors 32 extending between the battery and the respective components. In FIG. 4, the containment material 17 encasing the composite 16 of thermal energy battery 15 is partially cut away so as to expose the complex compound composite. A plurality of thermal conductors 18 are in thermal communication with the thermal energy battery and configured to direct heat from a temperature sensitive component to the thermal energy battery. Thus, the heat of the temperature sensitive components is directed to the thermal energy battery via the thermal conductors or to the thermal energy battery positioned in thermal contact with the components so that as the temperature of the components is elevated, so is the temperature of the complex compound incorporated composite of the thermal energy battery. As the battery is heated, refrigerant is desorbed by the complex compound and the internal battery pressure increases. When the threshold $\Delta P$ is reached, the containment material encasing the thermal energy battery ruptures and refrigerant is released. The composite is cooled and cooling is directed to the temperature sensitive component(s) via the thermal conductors.

Another use of the thermal energy battery is providing thermal control to temperature sensitive windows that use window pane material that needs to be maintained below high temperatures that cause the material to optically darken, deform, crack or otherwise deteriorate.

The complex compound composite of which the thermal energy battery described herein is formed, because of its structural integrity and strength, may also be used for structural components having single mission applications, for example, in rockets, missiles and other projectiles, which components become self-cooling at the trigger temperature as previously described.

Containment material for encasing the composite may be selected for its ability to rupture and/or enable release of the refrigerant through the material at pre-selected $\Delta P$s. Such materials include shellac or similar natural resins, polymer coatings such as epoxy resin, phenolic resin, neoprene, vinyl polymers including PBC, vinyl acetate or vinyl butyral copolymers, fluroplastics such as polychlorotrifluoroethylene, polytetrafluoroethylene, FEP fluoroplastics, polyvinylidene fluoride, chlorinated rubber and the like. Other examples of suitable materials include a thin, porous fluoropolymer membrane which has been coated with urethane, such as used in GORE-TEX®, such materials being impenetrable to outside moisture but which allow refrigerant molecules desorbed from the complex compound to escape through the membrane pores thereby releasing the refrigerant. It is to be understood that the aforesaid containment materials are given by way of example only and the list is not intended to be exhaustive or complete. Again, the containment material and its application (thickness, etc.) preferably provides for release of the refrigerant at a pre-selected threshold $\Delta P$ when the temperature of the battery has reached or exceeded the trigger temperature. The containment material may also provide increasing refrigerant release as temperatures rise and $\Delta P$ increases. Thus, the further the temperature of the battery and its composite is increased above the trigger temperature by increased component heating, the greater the desorption, the faster refrigerant is released by the battery, and the higher the cooling power density. Such a feature will provide for increased refrigerant release and increased cooling output to meet the cooling demands for maintaining the desired temperature of the temperature sensitive component.

The thermal energy battery including the complex compound, the density of the composite structure including the substrate material density, e.g., fabric weave, fiber density and thermal conductivity of the material used, as well as the containment material composition and thickness may be selected and configured to provide cooling for a relatively short period of time, e.g., a few seconds, or up to a substantially greater period of time, e.g., 10-30 minutes or more. Such selection of materials and components and the configuration of the thermal energy battery including its dimensions may also be selected to provide greater cooling density and refrigerant release, depending on the intended use and the environment to which the thermal energy battery and temperature sensitive components are exposed including anticipated cooling requirements. For example, where electronic components and computers are used for guidance systems of missiles which may be exposed to relatively high atmospheric entry temperatures over a longer period of time, a larger thermal energy battery and/or one having materials configured to provide a greater cooling capacity may be designated. The thermal conduction means may also be selected to meet the needs and spatial requirements between the thermal energy battery and the temperature sensitive components to be cooled, whether such means are by the use of metal or other thermal conducting rods, plates or other components such as heat pipes which allow more or less separation of the thermal energy battery from the components to be cooled, as compared to the thermal energy battery being in direct thermal or physical contact with the components. These as well as other variables in designing and configuring the thermal energy battery including its complex compound designation, substrate materials, containment material and thermal conduction components will be understood by those skilled in the art.

What is claimed is:

1. An apparatus for cooling one or more temperature sensitive components to achieve or maintain a selected temperature or operating temperature range of a temperature sensitive component, the apparatus comprising:
    a thermal energy battery configured to release refrigerant at or above a pre-selected trigger temperature comprising:
        a composite comprising a sorbent having ammonia, water, alcohol, amine or a fluorocarbon refrigerant absorbed thereon, and a substrate material incorporating said sorbent composition and comprising woven and/or nonwoven strands, fibers and/or filaments,
        a coating composition encasing said composite and configured to rupture and release said refrigerant therethrough when internal battery pressure reaches a threshold $\Delta P$ from the pressure outside said battery; and
    thermal conduction means in thermal contact between said thermal energy battery and a temperature sensitive component and configured for directing thermal energy between said battery and one or more temperature sensitive components.

2. The apparatus of claim 1 wherein said sorbent comprises zeolite, silica gel, activated carbon, a metal salt or a metal hydroxide.

3. The apparatus of claim 1 wherein said sorbent comprises a complex compound of ammonia, water, alcohol or amine and a metal salt and/or water and a metal hydroxide.

4. The apparatus of claim 3 wherein said metal salt comprises a halide, nitrate, nitrite, oxalate, perchlorate, sulfate or sulfite.

5. The apparatus of claim 1 wherein said strands, fibers or filaments are polarized.

6. The apparatus of claim 5 wherein said strands, fibers or filaments comprise glass, carbon, graphite, polyamide, polyphenylene sulfide and/or metal.

7. The apparatus of claim 1 wherein said thermal conduction means comprises one or more thermal conductors.

8. The apparatus of claim 7 wherein said one or more thermal conductors comprises thermal conducting arms, struts, shafts, pins, plates, pads, mesh and combinations of two or more thereof.

9. The apparatus of claim 7 wherein said one or more thermal conductors comprises one or more heat pipes or thermosyphons.

10. The apparatus of claim 8 wherein said one or more thermal conductors comprises one or more heat pipes or thermosyphons.

11. The apparatus of claim 1 wherein said thermal energy battery abuts or is in direct thermal contact with one or more temperature sensitive components.

12. An apparatus for cooling one or more temperature sensitive components to achieve or maintain a selected temperature or operating temperature range of a temperature sensitive component, the apparatus comprising:
- a thermal energy battery configured to release refrigerant at or above a pre-selected trigger temperature comprising:
  - a composite comprising a complex compound of ammonia, water, alcohol or amine refrigerant and a metal salt and/or water and a metal hydroxide, said metal comprising alkali metal, alkaline earth metal, transition metal, zinc, cadmium, tin, aluminum or two or more thereof, and a substrate material incorporating said complex compound and comprising woven and/or nonwoven strands, fibers and/or filaments,
  - a containment material encasing said composite and configured to rupture and release said refrigerant therethrough when internal battery pressure reaches a threshold $\Delta P$ from the pressure outside said battery; and
- thermal conduction means in thermal contact with said thermal energy battery and configured for directing thermal energy between said battery and one or more temperature sensitive components.

13. A temperature sensitive assembly comprising:
- one or more temperature sensitive components;
- a thermal energy battery configured to release refrigerant at or above a pre-selected trigger temperature comprising:
  - a composite comprising a complex compound of ammonia, water, alcohol or amine and a metal salt and/or water and a metal hydroxide, and a substrate material comprising woven and/or nonwoven strands, fibers and/or filaments,
  - a containment material encasing said composite and configured to rupture and release said refrigerant therethrough when internal battery pressure reaches a threshold $\Delta P$ from the pressure outside said battery; and
- thermal conduction means in thermal contact with said thermal energy battery and said one or more temperature sensitive components and configured for directing thermal energy therebetween.

14. The assembly of claim 13 wherein said metal comprises alkali metal, alkaline earth metal, transition metal, zinc, cadmium, tin, aluminum or two or more thereof.

15. The assembly of claim 13 wherein said metal salt comprises a halide, nitrate, nitrite, oxalate, perchlorate, sulfate or sulfite.

16. The assembly of claim 13 wherein said strands, fibers or filaments are polarized.

17. The assembly of claim 13 wherein said strands, fibers or filaments comprise glass, carbide, carbon, graphite, polyamide, polyphenylene sulfide and/or metal.

18. The assembly of claim 13 wherein said thermal conduction means comprises one or more thermal conductors configured to direct cooling to the one or more temperature sensitive components from the thermal energy battery.

19. The assembly of claim 17 wherein said one or more thermal conductors comprises thermal conducting arms, struts, shafts, pins, plates, pads, mesh and combination of two or more thereof.

20. The assembly of claim 17 wherein said one or more thermal conductors comprises one or more heat pipes or thermosyphons.

21. The assembly of claim 13 wherein said thermal energy battery abuts one or more temperature sensitive components.

22. The assembly of claim 13 wherein said one or more temperature sensitive components comprise electronic components.

23. A method of cooling a heat sensitive component comprising:
- providing a thermal energy battery configured to release refrigerant at or above a pre-selected trigger temperature comprising:
  - a composite comprising a complex compound of ammonia, water, alcohol or amine refrigerant and a metal salt and/or water and a metal hydroxide, and a substrate material comprising woven and/or nonwoven strands, fibers and/or filaments,
  - a containment material encasing said composite and configured to rupture and enable release of said refrigerant therethrough when internal battery pressure reaches a threshold $\Delta P$ from the pressure outside said battery;
- providing thermal conduction means in thermal contact with said thermal energy battery and one or more temperature sensitive components and configured for directing thermal energy therebetween;
- directing heat from said heat sensitive component to said composite and desorbing refrigerant therefrom and increasing internal battery pressure to reach a threshold $\Delta P$, and releasing refrigerant from said composite thereby cooling said battery composite; and
- directing cooling from said battery to said heat sensitive component via said thermal conduction means.

24. A thermal energy battery for cooling one or more temperature sensitive components, comprising:
- a composite comprising:
  - a substrate comprising a metal salt or metal hydroxide, and
  - a refrigerant adsorbed thereon;
- a containment material encasing said substrate and configured to rupture and release the refrigerant when internal battery pressure reaches a threshold $\Delta P$ from the external pressure; and
- a thermal conductor configured to contact the one or more temperature sensitive components for directing thermal energy therebetween.

25. The thermal energy battery of claim 24, wherein the refrigerant comprises ammonia, water, alcohol or amines.

26. The thermal energy battery of claim 24, wherein the substrate comprises woven strands, nonwoven strands, fibers or filaments.

27. The thermal energy battery of claim 24, wherein the containment material comprises one or more of a natural resin, polymer, epoxy resin, phenolic resin, neoprene or vinyl polymer.

28. A thermal energy battery of claim 24 further configured to direct heat from said one or more temperature sensitive components to said thermal energy battery via said thermal conductor to heat said composite and initiate desorption of refrigerant therein whereby internal battery pressure is elevated to and/or beyond said threshold ΔP causing rupture of said containment material and release of said refrigerant therethrough.

29. The thermal energy battery of claim 24 wherein said one or more thermal conductors comprises thermal conducting arms, struts, shafts, pins, plates, pads, mesh and combinations of two or more thereof.

30. The thermal energy battery of claim 24 wherein said one or more thermal conductors comprises one or more heat pipes or thermosyphons.

31. The thermal energy battery of claim 24 wherein said metal comprises alkali metal, alkaline earth metal, transition metal, zinc, cadmium, tin, aluminum or two or more thereof.

32. The thermal energy battery of claim 24 wherein said metal salt comprises a halide, nitrate, nitrite, oxalate, perchlorate, sulfate or sulfite.

* * * * *